(12) United States Patent
Shi et al.

(10) Patent No.: US 9,734,056 B2
(45) Date of Patent: Aug. 15, 2017

(54) CACHE STRUCTURE AND MANAGEMENT METHOD FOR USE IN IMPLEMENTING RECONFIGURABLE SYSTEM CONFIGURATION INFORMATION STORAGE

(71) Applicant: Southeast University, Jiangsu (CN)

(72) Inventors: Longxing Shi, Jiangsu (CN); Jun Yang, Jiangsu (CN); Peng Cao, Jiangsu (CN); Bo Liu, Jiangsu (CN); Jinjiang Yang, Jiangsu (CN); Leibo Liu, Jiangsu (CN); Shouyi Yin, Jiangsu (CN); Shaojun Wei, Beijing (CN)

(73) Assignee: Southeast University, Nanjing, Jiangsu (CN)

( * ) Notice: Subject to any disclaimer, the term of this patent is extended or adjusted under 35 U.S.C. 154(b) by 323 days.

(21) Appl. No.: 14/425,456

(22) PCT Filed: Nov. 13, 2013

(86) PCT No.: PCT/CN2013/087004
§ 371 (c)(1),
(2) Date: Mar. 3, 2015

(87) PCT Pub. No.: WO2014/090066
PCT Pub. Date: Jun. 19, 2014

(65) Prior Publication Data
US 2015/0254180 A1    Sep. 10, 2015

(30) Foreign Application Priority Data
Dec. 13, 2012 (CN) .......................... 2012 1 0538673

(51) Int. Cl.
*G06F 12/06*   (2006.01)
*G06F 12/08*   (2016.01)
(Continued)

(52) U.S. Cl.
CPC ...... *G06F 12/0646* (2013.01); *G06F 12/0811* (2013.01); *G06F 12/0895* (2013.01);
(Continued)

(58) Field of Classification Search
CPC ............ G06F 12/0646; G06F 12/0811; G06F 12/0895; G06F 17/5054; G06F 2212/283; G06F 2212/601
See application file for complete search history.

(56) References Cited

FOREIGN PATENT DOCUMENTS

| CN | 102207850 A | 10/2011 |
|---|---|---|
| CN | 102279753 A | 11/2011 |
| CN | 102236632 A | 12/2011 |

OTHER PUBLICATIONS

International Search Report in corresponding PCT application PCT/CN2013/087004 dated Jan. 23, 2014, 2 pp. in English and 2 pp. in Chinese.

*Primary Examiner* — Reginald Bragdon
*Assistant Examiner* — Mehdi Namazi
(74) *Attorney, Agent, or Firm* — Juan Carlos A. Marquez; Marquez IP Law Office, PLLC

(57) ABSTRACT

A cache structure for use in implementing reconfigurable system configuration information storage, comprises: layered configuration information cache units: for use in caching configuration information that may be used by a certain or several reconfigurable arrays within a period of time; an off-chip memory interface module: for use in establishing communication; a configuration management unit: for use in managing a reconfiguration process of the reconfigurable arrays, in mapping each subtask in an algorithm application to a certain reconfigurable array, thus the reconfigurable array will, on the basis of the mapped subtask, load the corresponding configuration information to complete a function reconfiguration for the reconfigurable array. This increases the utilization efficiency of configuration informa-
(Continued)

tion caches. Also provided is a method for managing the reconfigurable system configuration information caches, employing a mixed priority cache update method, and changing a mode for managing the configuration information caches in a conventional reconfigurable system, thus increasing the dynamic reconfiguration efficiency in a complex reconfigurable system.

6 Claims, 3 Drawing Sheets

(51) Int. Cl.
    *G06F 17/50*     (2006.01)
    *G06F 12/0811*     (2016.01)
    *G06F 12/0895*     (2016.01)

(52) U.S. Cl.
    CPC .... *G06F 17/5054* (2013.01); *G06F 2212/283* (2013.01); *G06F 2212/601* (2013.01)

CACHE STRUCTURE AND MANAGEMENT METHOD FOR USE IN IMPLEMENTING RECONFIGURABLE SYSTEM CONFIGURATION INFORMATION STORAGE

TECHNICAL FIELD

The present invention belongs to the embedded reconfigurable design field, and particularly relates to a cache structure for implementing reconfigurable system configuration information storage and a cache management method for configuration information in a reconfigurable system.

BACKGROUND ART

As the FPGA reconfigurable technology emerges, the conventional embedded design approach is greatly changed. As a new computing pattern in time-space domain, reconfigurable computing has wide application prospects in the embedded and high-performance computing field, and has become the developing trend of embedded systems now. The development of local dynamic reconfigurable technique represents a new reconfigurable design concept, and mainly consists of reconfigurable hardware and reconfigurable configuration control units that manage the functional reconfiguration of hardware. By updating the configuration information in the reconfigurable hardware, a reconfigurable configuration control unit maps the subtasks included in the algorithm application to the computing units in the reconfigurable hardware. The reconfigurable hardware can be fine-grained FPGA logical units or coarse-grained modules with specific functions. Thus, the execution of hardware functions is more flexible, the gap between software and hardware is narrowed, and hardware tasks can be invoked and configured as required in the same flexible way as software tasks.

Recently, reconfigurable computing has been widely applied in various engineering application fields, mainly including: video image processing, digital signal processing, wireless communication, and data encryption, etc. As the requirements of software applications become increasingly higher, the requirements for performance of reconfigurable systems become higher and higher. For example, the criterion for video decoding has evolved to 1080p or even higher, and the volume of code stream to be processed as per 1080p criterion is 5 times of the volume of code stream to be processed as per D1 criterion. Accordingly, as compared with applications in which D1 decoding is carried out, the processing performance of the reconfigurable system has to be 5 times as high as the former when 1080p decoding is carried out. The processing performance of a reconfigurable system is codetermined by the computing performance and reconfiguration performance of the reconfigurable hardware. The computing performance reflects the execution efficiency of each of the subtasks in the reconfigurable hardware, while the reconfiguration performance reflects the reconfiguration efficiency during functional switchover among the subtasks in the reconfigurable hardware. The requirements for improved reconfiguration performance mainly come from the following two aspects: on one hand, to improve the computing performance of a reconfigurable system, the computing units included in the reconfigurable system have to be escalated; consequently, the number of computing units to be reconfigured in the reconfigurable system becomes larger and larger. Accordingly, the data volume of configuration information required in the reconfiguration process is further increased, and the time required for dynamic reconfiguration is increased. On the other hand, to maximize the utilization of hardware computing resources in the reconfigurable system, the functions of the computing units have to be reconfigured frequently, so as to accomplish mapping of different tasks in the shortest time. Therefore, the time required for dynamic reconfiguration has to be reduced as much as possible. The improvement of computing performance of reconfigurable hardware can be implemented by adding more computing units and increasing the level of parallel computing among tasks. The key for optimizing the reconfiguration performance of a reconfigurable system is to improve the configuration information access efficiency in the reconfigurable system. However, how a local dynamic reconfigurable system can utilize the characteristics of the algorithm application to improve the configuration information access efficiency in the reconfigurable system has become a factor that constrains the development of reconfigurable technology.

In the design of a reconfigurable system, usually the configuration information is cached in on-chip configuration information caches, in order to optimize the configuration information access process. Therefore, the cache management method for configuration information determines the efficiency of dynamic reconfiguration. In a conventional reconfigurable system, the cache structure for configuration information storage is a centralized structure all reconfigurable arrays share one large configuration information cache) or a distributed structure (i.e., each reconfigurable array is closely coupled with a small configuration information cache). In the centralized configuration information cache structure, the shared configuration information cache encounters frequent access conflicts resulted from access from multiple reconfigurable arrays; consequently, the configuration information access efficiency is lowered. In the distributed configuration information cache structure, the utilization ratio of configuration information caches is lowered, owing to the fact that several configuration information caches store the same configuration information. Moreover, in the conventional cache management model for reconfigurable system configuration information, it is impossible to effectively use the configuration information caches and improve the configuration information access efficiency by utilizing the characteristics of the algorithm. As a result, the improvement of reconfiguration performance and processing performance of the reconfigurable system is limited.

CONTENTS OF THE INVENTION

Object of the invention: in view of the problems and drawbacks in the prior art, the object of the present invention is to provide a cache structure and a management method for implementing reconfigurable system configuration information storage, in order to improve the efficiency of dynamic reconfiguration of complex reconfigurable systems.

Technical solution: to attain the object described above, a first technical solution employed in the present invention is a cache structure for implementing reconfigurable system configuration information storage, comprising hierarchical configuration information cache units, an off-chip memory interface module, and a configuration management unit;

the hierarchical configuration information cache units are configured to cache the configuration information that may be used by one or more reconfigurable arrays within a time period;

the off-chip memory interface module is configured to establish communication between the hierarchical configuration information cache units and external memory;

the configuration management unit is configured to manage the reconfiguration process of the reconfigurable arrays, including: map the subtasks in the algorithm application to a reconfigurable array, and set a prioritizing strategy for the hierarchical configuration information cache units; when a new subtask is mapped to a reconfigurable array, the reconfigurable array will load the corresponding configuration information according to the mapped subtask, and accomplish functional reconfiguration of the reconfigurable array.

Preferably, the hierarchical configuration information cache units comprise L1 configuration information caches, L2 configuration information caches, and a L3 configuration information cache;

the L1 configuration information cache is closely coupled to a single reconfigurable array, and is configured to cache the configuration information that may be used only by the reconfigurable array within a time period;

the L2 configuration information cache is closely coupled to a single reconfigurable processing unit, and is configured to cache the configuration information that may be used by multiple reconfigurable arrays in the same reconfigurable processing unit within a time period;

the L3 configuration information cache can be accessed by multiple reconfigurable processing units in a shared mode, and is configured to cache the configuration information that may be used by the reconfigurable arrays in multiple reconfigurable processing units within a time period.

Preferably, the configuration management unit further sets a prioritizing strategy for the hierarchical configuration information cache units.

Preferably, the configuration information cache unit comprises:

a configuration information memory unit, which is configured to store the configuration information of the reconfigurable arrays temporarily;

a configuration information priority look-up table unit, which is configured to store the priority setting information of configuration information;

a configuration cache control logic unit, which is configured to manage the read access to the configuration information memory unit and the update of configuration information in the configuration information memory unit;

a configuration information input interface, which is configured to receive externally inputted configuration information, so that the configuration cache control logic unit can store the received configuration information into the configuration information memory unit;

a configuration information output interface, which is configured to enable external modules to read the configuration information in the configuration information memory unit.

Preferably, the configuration information cache unit further comprises: a priority setting interface, which is configured to initialize the priority setting in the configuration information cache unit, and input the priority setting information into the configuration information priority look-up table unit.

A second technical solution employed in the present invention is a configuration information cache management method, which utilizes the above-mentioned cache structure for implementing reconfigurable system configuration information storage, classifies the configuration information into three priority levels, and employs a mixed priority management strategy based on the three-level prioritization mechanism; the three priority levels include: frequency priority, which reflects whether a set of configuration information is read frequently, and the higher the frequency is, the higher the frequency priority is; correlation priority, which reflects whether there is an invocation relationship among different sets of configuration information, and the higher the number of invocations is, the higher the correlation priority is; computation complexity priority, which reflects whether a set of configuration information has to be accomplished by multiple reconfigurable arrays, and the higher the number of reconfigurable arrays required for accomplishing a set of configuration information is, the higher the computation complexity priority is; the mixed priority management strategy is as follows: (1) for a set of configuration information with high frequency priority and low computation complexity priority, keep the set of configuration information in the L1 configuration information caches preferentially; (2) for a set of configuration information with high frequency priority and high computation complexity priority, judge whether the reconfigurable arrays that require the current set of configuration information are in the same reconfigurable processing unit; if these reconfigurable arrays are in the same reconfigurable processing unit, keep the current set of configuration information in the L2 configuration information caches preferentially; otherwise, keep the current set of configuration information in the L2 configuration information caches and the L3 configuration information cache preferentially; (3) if the current set of configuration information has high priority of correlation with several other sets of configuration information, set those sets of configuration information as preferential replacement candidates once the current set of configuration information is replaced out of the configuration information cache units.

Beneficial effects: in the present invention, a mixed priority management method for the configuration information caches in a reconfigurable system and a cache structure for implementing reconfigurable system configuration information storage are provided. According to the characteristics of algorithm structure and the characteristics of algorithm mapping in the reconfigurable hardware, the configuration information is classified into three priority levels; in addition, based on the three-level prioritization mechanism, a mixed priority management strategy is employed, so as to improve the utilization ratio of all levels of configuration information caches, reduce access conflicts, and improve the access hit rate. With the method and structure in the present invention, the configuration information cache management model in conventional reconfigurable systems is changed, and thereby the dynamic reconfiguration efficiency in a complex reconfigurable system is improved.

EMBODIMENTS

Hereunder the present invention will be further detailed in embodiments, with reference to the accompanying drawings. It should be appreciated that these embodiments are provided only for describing the present invention, and shall not be deemed as constituting any limitation to the scope of the present invention. Those skilled in the art can make various equivalent modifications to the present invention without departing from the spirit of the present invention, but all these modifications shall be deemed as falling into the protected scope as confined by the attached claims.

Figure 1:
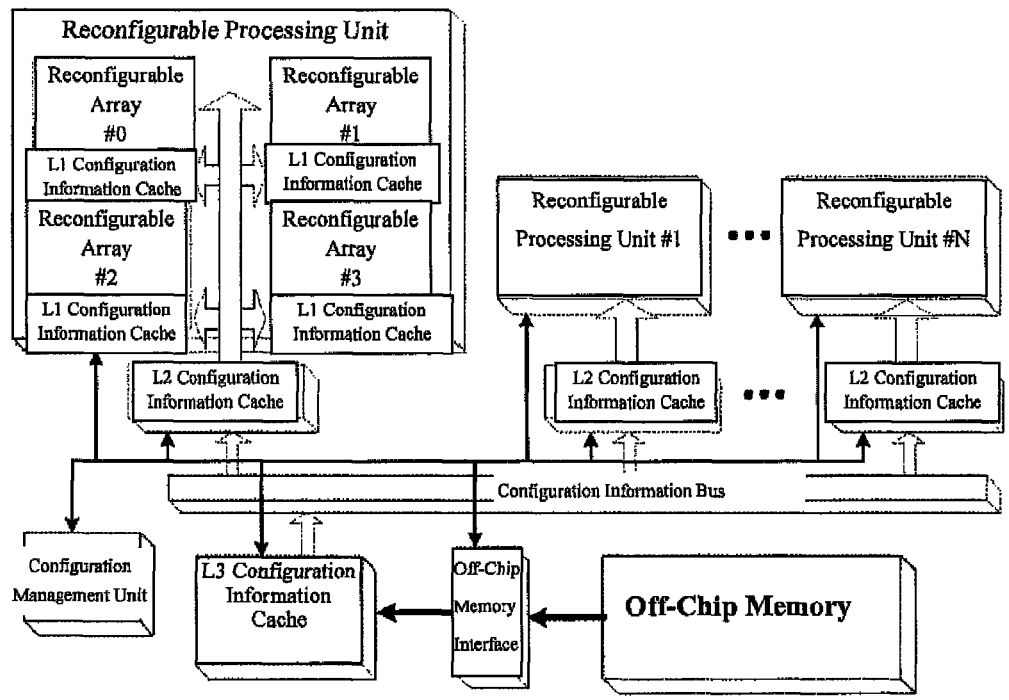
FIG. 1 is a schematic structural diagram of the cache structure for implementing reconfigurable system configuration information storage according to the embodiments of the present invention.
Figure 2:
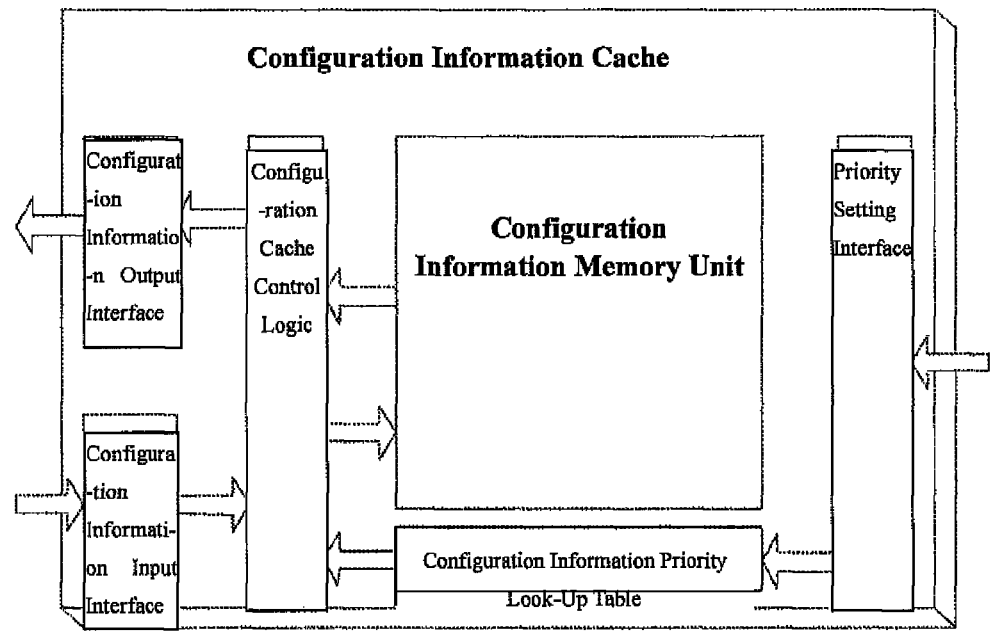
FIG. 2 is a schematic structural diagram of a configuration information cache.

As shown in FIG. 1, a cache structure for implementing reconfigurable system configuration information storage comprises: hierarchical configuration information cache units, configured to cache configuration information that may be used by one or more reconfigurable arrays within a time period; an off-chip memory interface module, configured to establish communication between the hierarchical configuration information cache units and external memory (i.e., the off-chip memory shown in the figure); a configuration management unit, configured to manage the reconfiguration process of reconfigurable arrays, and map the subtasks in the algorithm application to a reconfigurable array, so that the reconfigurable array can load corresponding configuration information according to the mapped subtask to accomplish the functional reconfiguration of the reconfigurable array. Wherein, the configuration information caches at all levels have a similar hardware structure, which, as shown in FIG. 2, comprises: a configuration information memory unit, configured to store the configuration information of the reconfigurable arrays temporarily; a configuration information priority look-up table unit, configured to store the priority setting information of configuration information; a configuration cache control logic unit, configured to manage read access to the configuration information memory unit and update of the configuration information in the configuration information memory unit; a configuration information input interface, configured to receive externally inputted configuration information, so that the configuration cache control logic unit can store the received configuration information into the configuration information memory unit; a configuration information output interface, configured to enable external modules to read the configuration information stored in the configuration information memory unit; a priority setting interface, configured to initialize the priority setting in the configuration information cache.

Figure 3:
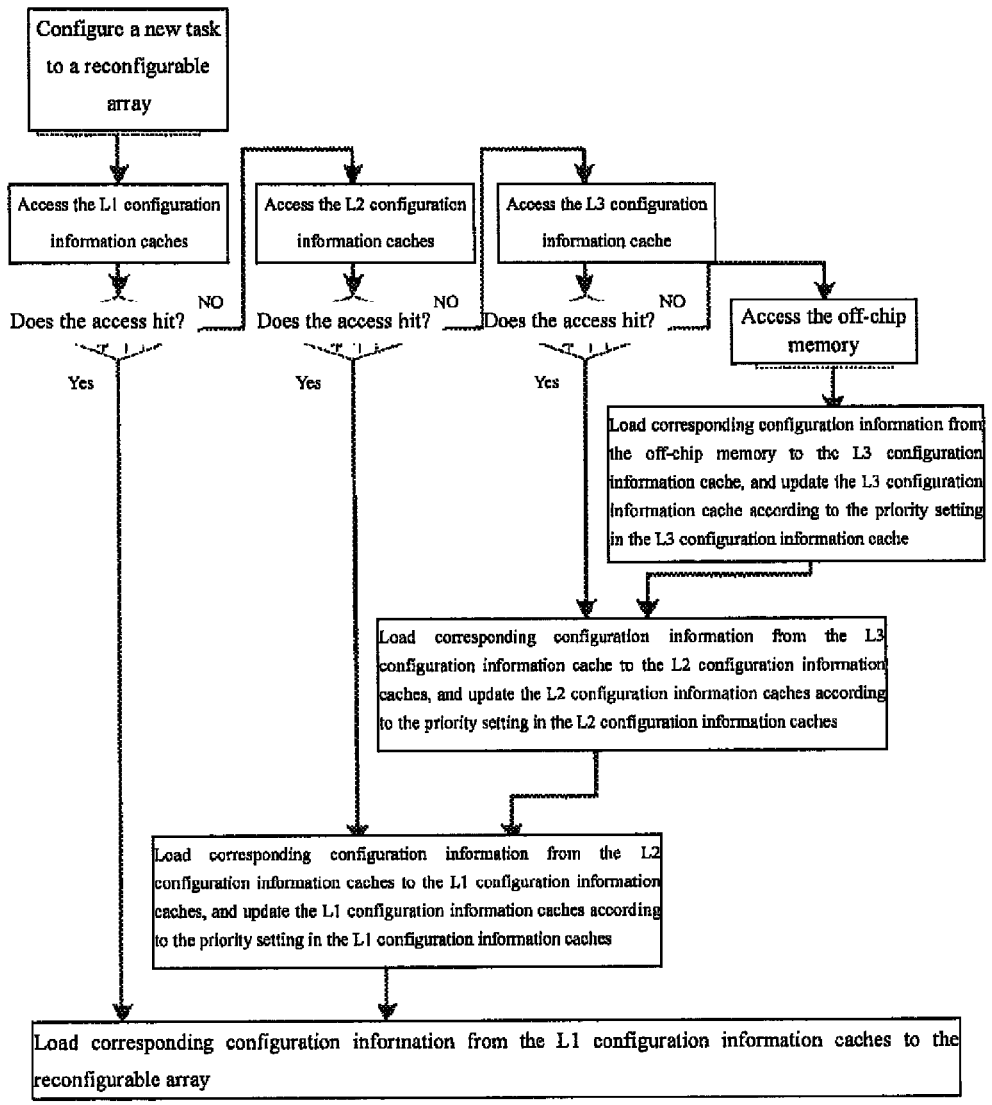
FIG. 3 is a workflow chart of the configuration information caches in a reconfigurable system.

As shown in FIG. 3, the working process of the configuration information caches in a reconfigurable system comprises loading of configuration information and update of configuration information caches. Wherein, the loading procedure of configuration information comprises the following five steps:

(1) the configuration management unit maps a new subtask to a reconfigurable array in the process of system operation;
(2) the reconfigurable array reads the configuration information corresponding to the current mapped subtask from the L1 configuration information caches; if the currently required configuration information is in the L1 configuration information caches, it means that the access hits, then, the required configuration information is directly read and loaded into the reconfigurable array, and the functional reconfiguration of the reconfigurable array is accomplished; otherwise, it means that the access does not hit, and then, the execution goes to step (3);
(3) the L1 configuration information caches read configuration information from the L2 configuration information caches; if the currently required configuration information is in the L2 configuration information caches, it means that the access hits, then, the required configuration information is directly read, the L1 configuration information caches are updated, and then the execution goes to step (2); otherwise, it means the access does not hit, and then, the execution goes to step (4);
(4) the L2 configuration information caches read configuration information from the L3 configuration information cache; if the currently required configuration information is in the L3 configuration information cache, it means that the access hits, then, the required configuration information is directly read, the L2 configuration information caches are updated, and then the execution goes to step (3); otherwise, it means the access does not hit, and then, the execution goes to step (5);
(5) the L3 configuration information cache reads configuration information from the off-chip memory, and the L3 configuration information cache is updated accordingly; then, the execution goes to step (4).

Figure 4:
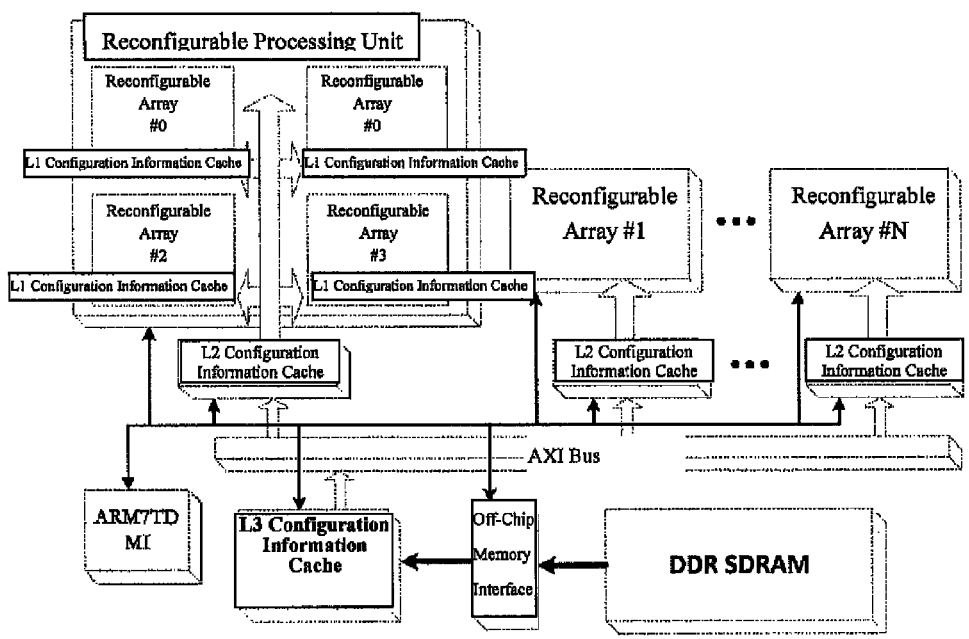
FIG. 4 shows microprocessor application connections for implementing reconfigurable system configuration management according to the embodiments of the present invention.

As shown in FIG. 4, the mixed priority management method for configuration information caches in a reconfigurable system and the cache structure for implementing reconfigurable system configuration information storage provided in the present invention are used for high definition digital video decoding in H.264 protocol (H.264 1080p@30 fps HiP@Level 4), to meet the requirement for high definition video decoding at H.264 1080p@30 fps HiP@Level 4. The system structure comprises: an ARM7TDMI processor that serves as a configuration management unit, a reconfigurable processing unit, L1 configuration information caches, L2 configuration information caches, a L3 configuration information cache, an AXI bus that serves as a configuration information bus, an off-chip memory interface, and a piece of DDR SDRAM that serves as off-chip memory. An ARM7TDMI processor that has advantages including compact size, high speed, low power consumption, and good compiler support is used as a configuration management unit to control the scheduling and configuration during system operation; the L3 configuration information cache is connected with the L2 configuration information caches through a 64-bit AXI bus; the L2 configuration information cache is connected with the L1 configuration information caches via a special access interface with 128-bit data bit width; the L1 configuration information cache is connected with the reconfigurable array via a special access interface with 256-bit data bit width; the external memory is a piece of commonly used embedded DDR SDRAM external memory, which supports 64-bit data bit width and has high cost-performance and lower specific energy consumption; two reconfigurable processing units are deployed, and each reconfigurable processing unit comprises 4 reconfigurable arrays, each reconfigurable array comprises 8×8 reconfigurable computing units, and each computing unit supports 16-bit arithmetical operation and logical operation in a single cycle. For the verification system, core of each configuration information is 2 Kbits in size. The capacity of configuration information caches is set to: 8× L1 configuration information caches, each has 1 Kbytes capacity; 2× L2 configuration information caches, each has 4 Kbytes capacity; 1× L3 configuration information cache, with 8 Kbytes capacity; thus, the total capacity of the configuration information caches is: 1×8+4×2+8×1=32 Kbytes. For comparison purpose, comparative verification system 1 and comparative verification system 2 are deployed. Wherein, in the comparative verification system 1, a centralized configuration information cache structure is employed, and thus the L1 configuration information caches and L2 configuration information caches are removed, while only a L3 configuration information cache is kept, and the capacity of the L3 configuration information cache is set to 32 Kbytes. A similar cache management method is used, and the update strategy is a LRU (Least Recently Used) strategy that is commonly used in the conventional design. In the comparative verification system 2, a distributed configuration information cache structure is employed, and thus the L2 configuration information caches and L3 configuration information cache are removed, while only 8× L1 configuration information caches are kept, and the capacity of each L1 configuration information cache is set to 4 Kbytes. Thus, the total capacity is also 32 Kbytes. A similar cache management method is used, and the update strategy is also a LRU strategy that is commonly used in the conventional design. The experimental result indicates: with the same configuration information cache capacity (32 Kbytes), the number of cycles required for accomplishing functional reconfiguration in the reconfigurable system that employs the cache structure for configuration information storage and the configuration information cache management method according to the present invention is only 30% of the number of cycles required in the comparative verification system 1 and comparative verification system 2 or lower, in other words, the reconfiguration efficiency is improved by more than three times.

The invention claimed is:

1. A cache structure for implementing reconfigurable system configuration information storage, comprising hierarchical configuration information cache units memories, an off-chip memory interface, and a configuration management unit processor:
   the hierarchical configuration information cache memories are configured to cache configuration information that may be used by one or more reconfigurable arrays within a time period; the off-chip memory interface module is configured to establish communication between the hierarchical configuration information cache memories and external memory;
   the configuration management processor is configured to manage a reconfiguration process of the reconfigurable arrays, comprising: map subtasks in an algorithm application to a reconfigurable array, and set a prioritizing strategy for the hierarchical configuration information cache memories: when a new subtask is mapped to a reconfigurable array, the reconfigurable array will load the corresponding configuration information according to the mapped subtask, and accomplish functional reconfiguration of the reconfigurable array.

2. The cache structure for implementing reconfigurable system configuration information storage according to claim 1, wherein, the hierarchical configuration information cache memories comprise L1 configuration information caches, L2 configuration information caches, and a L3 configuration information cache;
   the L1 configuration information cache is closely coupled to a single reconfigurable array, and is configured to cache the configuration information that may be used only by the reconfigurable array within a time period;
   the L2 configuration information cache is closely coupled to a single reconfigurable processing unit, and is configured to cache the configuration information that may be used by multiple reconfigurable arrays in the same reconfigurable processing unit within a time period;
   the L3 configuration information cache can be accessed by multiple reconfigurable processing units in a shared mode, and is configured to cache the configuration information that may be used by the reconfigurable arrays in multiple reconfigurable processing units within a time period.

3. A configuration information cache management method that utilizes the cache structure for implementing reconfigurable system configuration information storage as set forth in claim 2, wherein, the method classifies the configuration information into three priority levels, and employs a mixed priority management strategy based on the three-level prioritization mechanism; the three priority levels comprise: frequency priority, which reflects whether a set of configuration information is read frequently; correlation priority, which reflects whether there is an invocation relationship among different sets of configuration information; computation complexity priority, which reflects whether a set of configuration information has to be accomplished by multiple reconfigurable arrays; the mixed priority management strategy is as follows: (1) for a set of configuration information with high frequency priority and low computation complexity priority, keep the set of configuration information in the L1 configuration information caches preferentially; (2) for a set of configuration information with high frequency priority and high computation complexity priority, judge whether the reconfigurable arrays that require a current set of configuration information are in the same reconfigurable processing unit; if these reconfigurable arrays are in the same reconfigurable processing unit, keep the current set of configuration information in the L2 configuration information caches preferentially; otherwise, keep the current set of configuration information in the L2 configuration information caches and the L3 configuration information cache preferentially; (3) if the current set of configuration information has high priority of correlation with several other sets of configuration information, set those sets of configuration information as preferential replacement candidates once the current set of configuration information is replaced out of the configuration information cache memories.

4. The cache structure for implementing reconfigurable system configuration information storage according to claim 1, wherein, the configuration management processor further sets a prioritizing strategy for the hierarchical configuration information cache memories.

5. The cache structure for implementing reconfigurable system configuration information storage according to claim 1, wherein, a hierarchical configuration information cache memory comprises:
   a configuration information memory, which is configured to store the configuration information of the reconfigurable arrays temporarily;
   a configuration information priority look-up table, which is configured to store priority setting information of configuration information;
   a configuration cache control logic unit, which is configured to manage read access to the configuration information memory and an update of configuration information in the configuration information memory;
   a configuration information input interface, which is configured to receive externally inputted configuration information, so that the configuration cache control logic unit can store the received externally inputted configuration information into the configuration information memory;
   a configuration information output interface, which is configured to enable external modules to read the configuration information in the configuration information memory.

6. The cache structure for implementing reconfigurable system configuration information storage according to claim 5, wherein, the configuration information cache memory further comprises: a priority setting interface, configured to initialize a priority setting in the configuration information cache memory, and input the priority setting information into the configuration information priority look-up table.

* * * * *